(12) United States Patent
Kreifels

(10) Patent No.: US 7,200,708 B1
(45) Date of Patent: Apr. 3, 2007

(54) APPARATUS AND METHODS FOR STORING DATA WHICH SELF-COMPENSATE FOR ERASE PERFORMANCE DEGRADATION

(75) Inventor: Jerry A. Kreifels, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 478 days.

(21) Appl. No.: 10/750,364

(22) Filed: Dec. 31, 2003

(51) Int. Cl.
*G11C 16/02* (2006.01)

(52) U.S. Cl. .................................. 711/103; 365/185.33
(58) Field of Classification Search ................ 711/103; 365/185.33
See application file for complete search history.

(56) References Cited

U.S. PATENT DOCUMENTS

| | | | | |
|---|---|---|---|---|
| 5,297,148 A | * | 3/1994 | Harari et al. ................ | 714/710 |
| 5,369,615 A | * | 11/1994 | Harari et al. .......... | 365/185.19 |
| 5,920,508 A | * | 7/1999 | Miyakawa et al. ..... | 365/185.22 |
| 6,891,752 B1 | * | 5/2005 | Bautista et al. ......... | 365/185.11 |

* cited by examiner

*Primary Examiner*—Brian R. Peugh
*Assistant Examiner*—Jared Rutz
(74) *Attorney, Agent, or Firm*—Troutman Sanders LLP; Jeffrey L. Waters

(57) ABSTRACT

In some embodiments, an apparatus and methods for storing data which self-compensate for erase performance degradation. Such an apparatus includes, in an exemplary embodiment, a plurality of memory blocks individually erasable during erase cycles by the application of erase pulses thereto having appropriate erase pulse voltage levels, and a memory location uniquely associated with each memory block that stores an initial erase pulse voltage level therefor to be used during an erase cycle. Such methods include, in an exemplary embodiment, counting the number of erase pulses applied to each memory block during an erase cycle therefor, comparing the count for each memory block to a threshold count value, and updating the stored initial erase pulse voltage level to be used during a subsequent erase cycle for each respective memory block if the count for that memory block is not less than the threshold count. Other embodiments are described and claimed.

16 Claims, 4 Drawing Sheets

APPARATUS AND METHODS FOR STORING DATA WHICH SELF-COMPENSATE FOR ERASE PERFORMANCE DEGRADATION

BACKGROUND OF THE INVENTION

Many of today's electronic and electronically-controlled devices incorporate various types of memory to store data, including, software instructions which are executable by a processing unit, run-time data which is utilized during a single session of a device's use or operation and is then discarded, and persistent data which may be utilized during different sessions of a device's use or operation and which is maintained between such sessions. The various types of memory are often described as belonging to two fundamental categories of memory known as "volatile" and "non-volatile" memory. Generally, the volatile memory category includes those memory devices which store data therein as long as electrical power is supplied to them, while the non-volatile memory category includes those memory devices store data therein on a persistent basis regardless of whether electrical power is supplied to them. Both volatile memory devices and non-volatile memory devices are available in a number of different forms which use a number of different technologies to store data.

One such form of non-volatile memory devices includes flash memory devices which, typically, have a plurality of memory blocks that must be fully erased before new data may be written to and stored therein. Erasure of the memory blocks of a flash memory device is, generally, performed during each erase cycle by applying an electrical erase pulse having an initial erase pulse voltage level to the memory blocks. After application of the erase pulse, the memory blocks are examined to determine whether full erasure has been accomplished. If not, another erase pulse is applied to the memory blocks and the memory blocks are again examined to determine whether full erasure has been accomplished. The application of erase pulses and examination of the memory blocks is repeated until full erasure of the memory blocks is detected during an examination. Notably, the erase pulses applied to each memory block have the same initial erase pulse voltage level and the time required to erase each memory block is directly related to the erase voltage level of such erase pulses.

Unfortunately, repeated erasures of the memory blocks of a flash memory device tend to cause the device's erase performance to degrade, thereby resulting in each successive erase cycle requiring the application of an increased number of erase pulses to accomplish full erasure of the memory blocks and, hence, requiring an increased amount of time for full erasure of the memory blocks. In an attempt to overcome this inherent characteristic of flash memory devices and to reduce erase cycle times, a running count of the applied erase pulses may be maintained and compared against a pre-determined first threshold count after each examination of the memory blocks. If the running count of applied erase pulses exceeds the first threshold count, another comparison may then made to determine whether the running count of applied erase pulses minus the number of applied erase pulses at which the erase pulse voltage level was last incremented exceeds a pre-determined second threshold count. If so, the erase pulse voltage level of all subsequent erase pulses may be incremented, or increased, by a pre-determined incremental voltage level prior to the application of the erase pulses to the memory blocks. It should be noted, however, that while increasing the erase pulse voltage level of subsequent erase pulses has resulted in reduced erase cycle times, further reduction in the erase cycle times of flash memory devices may be advantageous.

DETAILED DESCRIPTION OF THE INVENTION

Figure 1:
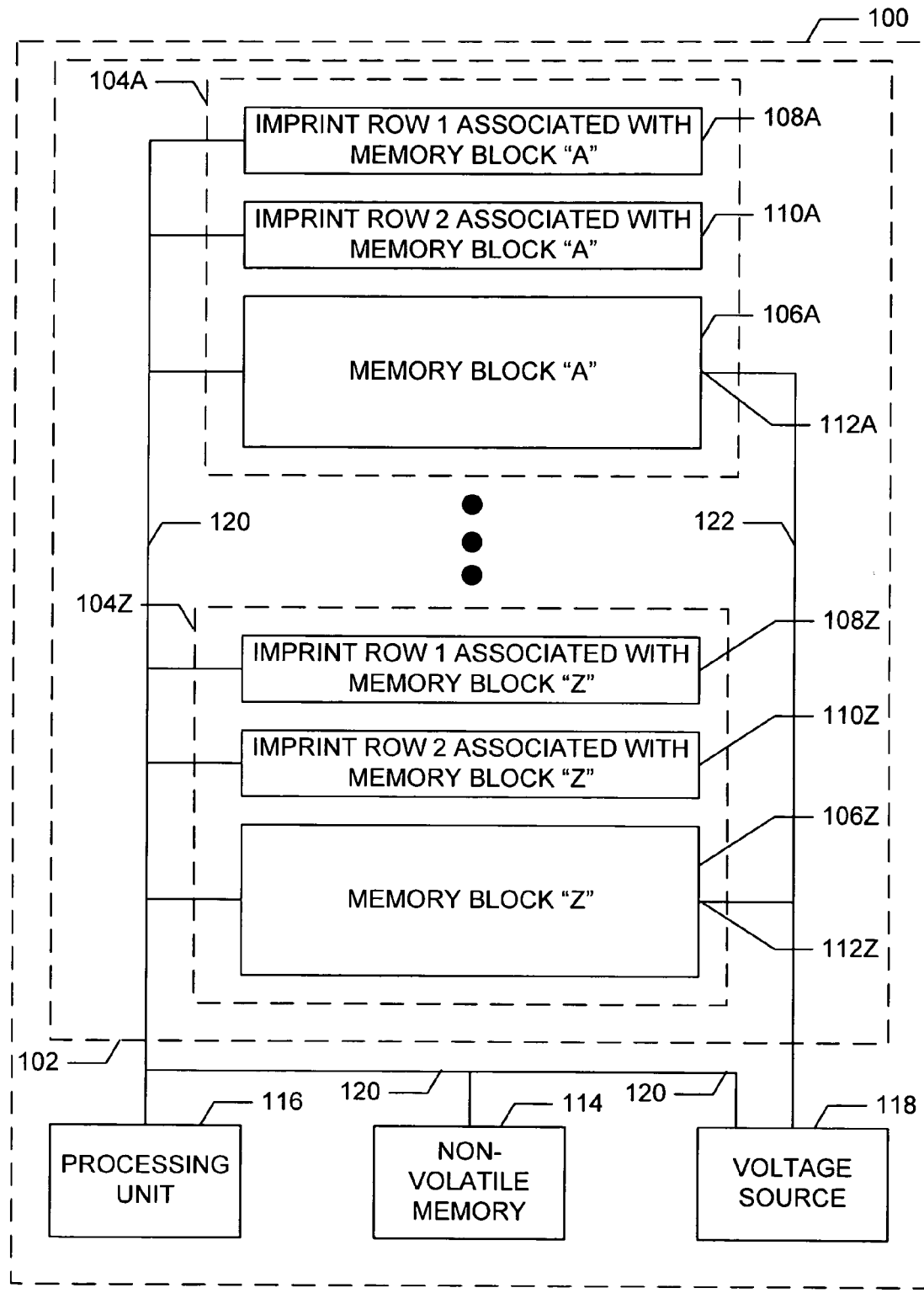
FIG. 1 is a partial block diagram representation of a memory device in accordance with an exemplary embodiment of the present invention.

Referring now to the drawings in which like numerals represent like elements throughout the several views, FIG. 1 displays a partial block diagram representation of a memory device 100 in accordance with an exemplary embodiment of the present invention for use in storing and maintaining persistent data. The memory device 100 may comprise a memory block array 102 adapted to store persistent data for an electronic or electronically-controlled device with which the device 100 is incorporated. The memory block array 102 may include one or more memory block units 104 with each memory block unit 104 being designated in FIG. 1 with an alphabetic subscript between "A" and "Z". Each memory block unit 104 may have a memory block 106, a first imprint memory row 108, and a second imprint memory row 110 with the first and second imprint memory rows 108, 100 being uniquely associated with each memory block unit 104 and with each memory block 106 thereof. Each memory block 106 may have an erase terminal 112 that is operable to receive erase pulses, or signals, at various erase pulse voltage levels that cause erasure of data stored in the memory block 106. Each imprint memory row 108, 110 may comprise one or more non-volatile memory locations which store data (including, but not limited to, an initial erase pulse voltage level and other configuration or status data) relevant only to the memory block 106 with which the imprint memory row 108, 110 is associated. Generally, each imprint memory row 108, 110 stores the same types of data, but only one imprint memory row 108, 110 stores data which is "active" or "valid" at a given time and, hence, that imprint memory row 108, 110 may be referred to herein as the "currently valid imprint memory row 108, 110". The currently valid imprint memory row 108, 110 may be identified by a pointer, flag, or other identifier stored in the imprint memory row 108, 110 itself, in non-volatile memory 114, or elsewhere internal or external to memory device 100. By storing the initial erase pulse voltage level to use for erasing each memory block 106 in an imprint memory row 108, 110 respectively associated therewith, the initial erase pulse voltage level may be uniquely customized for each memory block 106 at the time of the device's manufacture and may be updated during the device's operation, as described below, in an attempt to offset erase performance degradation of the respective memory blocks 106 and reflect erase performance during a prior erase cycle. It should be noted, however, that the data stored in an imprint memory row 108, 110 may, in another exemplary embodiment, be stored in a memory such as the non-volatile memory 114 described below or other memory.

In the exemplary embodiment of FIG. 1, the memory blocks 106 comprise flash memory blocks 106 having an erase terminal 112 which is often referred to as a "well terminal 112". As a consequence, the initial erase pulse voltage level of the erase pulses applied to the erase terminal 112 may sometimes be referred to as the "initial erase pulse voltage level". It should be noted, however, that in other exemplary embodiments, the memory blocks 106 may comprise other forms or types of memory and the erase terminals 112 and initial erase pulse voltage level may be referred to by other terms.

The memory device 100 may further comprise a non-volatile memory 114 operable to store data used by the device 100 for its operation, a processing unit 116 operable to execute software or firmware instructions which, when executed, cause operation of the memory device 100 in accordance with the methods 200, 300 described below, and a voltage source 118 adapted to generate erase pulses at voltage levels determined by the processing unit 116 and to apply the erase pulses to the erase terminal(s) 112 of one or more of the memory blocks 106 as described below in more detail. The processing unit 116 may be connected to each memory block 106 and the imprint memory rows 108, 110 associated therewith, to the non-volatile memory 114, and to the voltage source 118 by a bus 120 adapted to communicate addresses and data. The voltage source 118 may be connected to each memory block 106 via a signal path 122 that is configured to communicate erase pulses from the voltage source 118 to each memory block 106. The non-volatile memory 114 may comprise a variety of forms or types of non-volatile memory, and the data stored therein may include an initial voltage level for erase pulses (also sometimes referred to herein as an "initial erase pulse voltage level"), device configuration and/or status data, and/or software instructions executable by the processing unit 116 during operation of the device 100. The processing unit 116 may comprise any of a number of different forms or types of processors, controllers, or circuitry which are capable of executing software or firmware instructions stored in the non-volatile memory 114, in the processing unit 116 itself, or in another memory.

Figure 2:
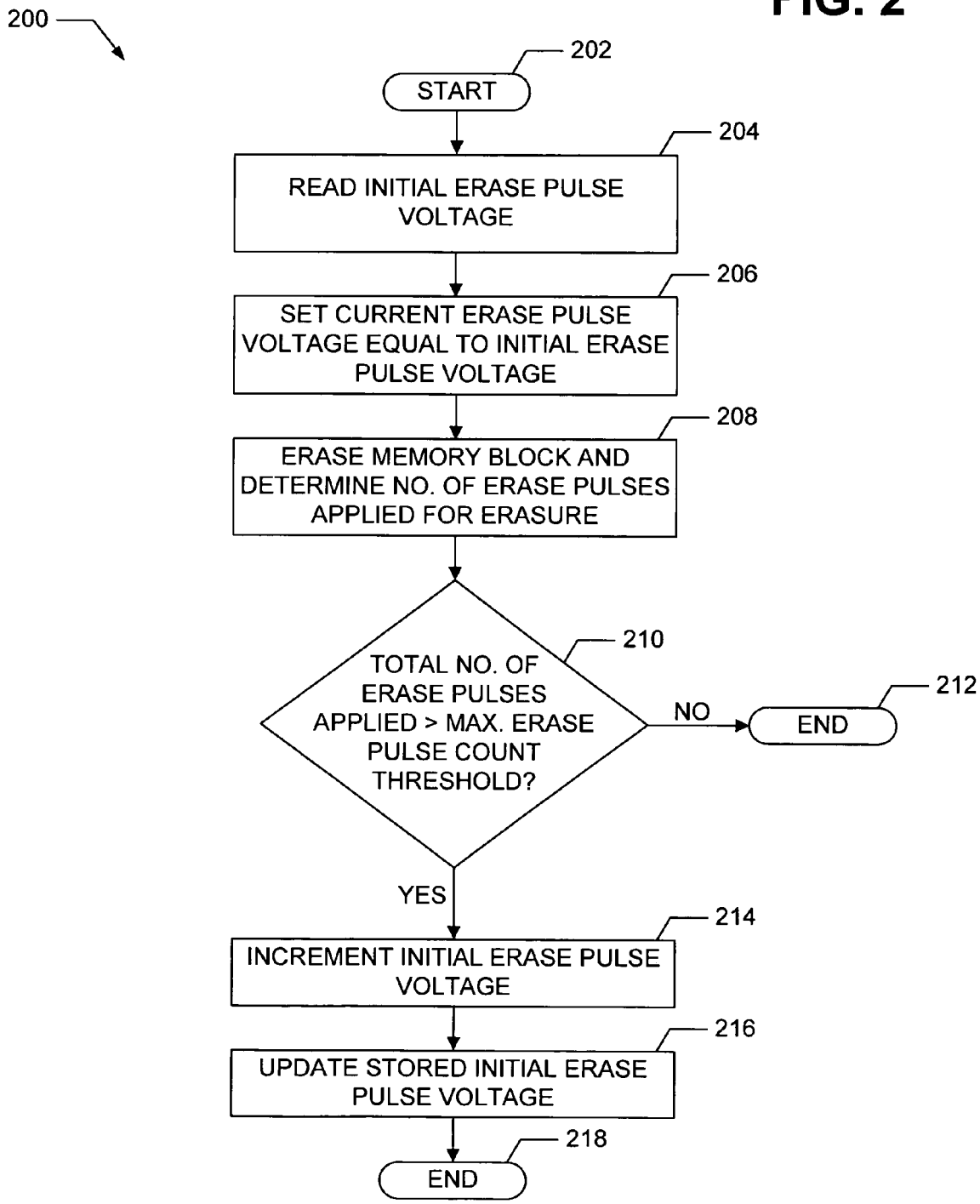
FIG. 2 is a flowchart representation of a method employable by the memory device of FIG. 1 to self-compensate for erase performance degradation of a memory block thereof.

FIG. 2 displays a flowchart representation of a method 200 employable by the memory device 100 of FIG. 1 to self-compensate for erase performance degradation of a memory block 106 due to repeated erasures of the memory block 106. In the exemplary embodiments described herein, method 200 may be implemented through execution, by the processing unit 116, of software or firmware instructions stored in the non-volatile memory 114, in the processing unit 116 itself, or in other memory. After starting at 202, the processing unit 116 may read, at 204, the initial erase pulse voltage level for initial erase pulses which are to be applied to the erase terminal 112 of the memory block 106 being erased during an erase cycle thereof. If the memory block 106 has not been previously erased (i.e., there has been no prior erase cycle performed on the memory block 106), the initial erase pulse voltage level may be read from the non-volatile memory 114 or from the currently valid imprint memory row 108, 110 (which may be either of the first or second imprint memory rows 108, 110, depending on which imprint memory row 108, 110 stores valid data at the time of reading). If the memory block 106 has been previously erased (i.e., a prior erase cycle has been performed on the memory block 106), the initial erase pulse voltage level may be read from the currently valid imprint memory row 108, 110 (which, again, may be either of the first or second imprint memory rows 108, 110, depending on which imprint memory row 108, 110 stores valid data at the time of reading) which is uniquely associated with the memory block 106 being erased.

Next, at 206, the processing unit 116 may set the current erase pulse voltage level equal to the initial erase pulse voltage level read, at 204, from non-volatile memory 114 or an imprint memory row 108, 110 associated with the memory block 106 being erased. The current erase pulse voltage level, generally, corresponds to the voltage level of the erase pulses which may be generated and applied to the memory block 106 to accomplish erasure thereof, and which may be incremented during an erase cycle to accomplish full erasure of the memory block 106 being erased. Continuing at 208, the memory block 106 is then erased and a determination of the total number of erase pulses applied for such erasure is made using the exemplary method 300 described more fully below or other similar method.

After the memory block 106 has been erased, a comparison may be made at 210 by the processing unit 116 to ascertain whether the total number of erase pulses actually applied for erasure was greater than a maximum erase pulse count threshold. The maximum erase pulse count threshold, generally, corresponds to a number of erase pulses which if exceeded during an erase cycle for a memory block 106 by the total number of erase pulses actually applied for erasure of that memory block 106, causes the initial erase pulse voltage level for that memory block 106 to be incremented and updated in an imprint memory row 108, 110 for that memory block 106. The maximum erase pulse count threshold may be hard-coded in software or firmware executed by the processing unit 116, may be stored in non-volatile memory 114, may be stored in an imprint memory row 108, 110, or may be stored elsewhere internal or external to memory device 100. For flash memory devices manufactured in accordance with the exemplary embodiments described herein, the maximum erase pulse count threshold may be approximately 25 erase pulses. It should be understood, however, that other values for the maximum erase pulse count threshold may be employed for other devices or in connection with other exemplary embodiments. While the maximum erase pulse count threshold, generally, constitutes a single value applicable to all memory blocks 106 of the memory device 100 in the exemplary embodiments described herein, multiple maximum erase pulse count thresholds may be employed for different memory blocks 106 in other exemplary embodiments of the present invention.

If, at 210, it is ascertained that the total number of erase pulses actually applied to achieve erasure of the memory block 106 did not exceed the maximum erase pulse count threshold, the method 200 ends at 212 with no change being made to the initial erase pulse voltage level for the erased memory block 106. If, at 210, it is ascertained that the total number of erase pulses actually applied to achieve erasure of the memory block 106 exceeded the maximum erase pulse count threshold, the initial erase pulse voltage level for the memory block 106 may be incremented, or increased, at 214 by an initial erase pulse voltage level increment value. Generally, the initial erase pulse voltage level increment value comprises an increment appropriate to bring the total number of erase pulses required for erasure of the memory block 106 during the block's next erase cycle under the maximum erase pulse count threshold. For flash memory devices made according to the exemplary embodiments described herein, the initial erase pulse voltage level increment value may be approximately 50 millivolts. However, it should be understood that other values for the initial erase pulse voltage level increment value may be employed. The initial erase pulse voltage level increment value may be hard-coded in software or firmware executed by the processing unit 116, may be stored in non-volatile memory 114, may be stored in an imprint memory row 108, 110, or may be stored elsewhere internal or external to memory device 100. While the initial erase pulse voltage increment value, typically, constitutes a single value applicable to all memory blocks 106 of the memory device 100 in the exemplary embodiments described herein, multiple initial erase pulse voltage increment values may be employed for different memory blocks 106 in other exemplary embodiments of the present invention.

Proceeding to 216, the initial erase pulse voltage level stored in the currently valid imprint memory row 108, 110 for the erased memory block 106 may be updated with the incremented initial erase pulse voltage level so that the incremented initial erase pulse voltage level may be employed during one or more subsequent erase cycles of the erased memory block 106. In order to perform such updating, the processing unit 116 may: read all of the data stored in the currently valid imprint memory row 108, 110 associated with the erased memory block 106; replace the initial erase pulse voltage level present in the read data with the incremented initial erase pulse voltage level to produce updated data; set a pointer, flag, or other identifier present in the updated data (if any) to identify the currently invalid imprint memory row 108, 110 for the erased memory block 106 as the currently valid imprint memory row 108, 110 for the erased memory block 106; erase the currently invalid imprint memory row 108, 110 for the erased memory block 106; write or store the updated data to or in the currently invalid imprint memory row 108, 110; and, update the pointer, flag, or other identifier (if not present in the updated data and not already updated) to identify the imprint memory row 108, 110 in which the updated data was stored as the currently valid imprint memory row 108, 110 for the erased memory block 106. Then, method 200 ends at 218.

It should be noted that in another exemplary embodiment of the present invention, updating of the initial erase pulse voltage level stored in the currently valid imprint memory row 108, 110 for a memory block 106 with the incremented initial erase pulse voltage level may be made prior to erasure of that memory block 106 so that the block's currently valid imprint memory row 108, 110 may be erased with that memory block 106. By doing so, the risk of losing such data (e.g., due to a power loss or other event) may be minimized. In order to accomplish such updating and erasure, each imprint memory row 108, 110 may include an "increment flag" indicating that the initial erase pulse voltage level of such row 108, 110 should be incremented if the row's data is copied. According to such an exemplary embodiment, the processing unit 106 may accomplish copying of the row's data and erasure of the memory block 106 by: reading the data present in the currently valid imprint memory row 108, 110 (including the initial erase pulse voltage level and increment flag); if the increment flag is set, incrementing the initial erase pulse voltage level and storing the incremented initial erase pulse voltage level in the currently invalid imprint memory row 108, 110; if the increment flag is not set, storing the initial erase pulse voltage level from the currently valid imprint memory row 108, 110 in the currently invalid imprint memory row 108, 110 without incrementing; leaving the increment flag in the currently invalid imprint memory row 108, 110 unset; performing erasure of the memory block 108 (as described above) and the currently valid imprint memory row 108, 110; after erasure, determining if the maximum erase pulse count threshold was exceeded by the total number of erase pulses actually applied for erasure; if the maximum erase pulse count exceeded the total number of erase pulses actually applied for erasure, setting the increment flag in the currently invalid imprint memory row 108, 110; and, setting the pointer, flag, or other identifier identifying the currently valid imprint memory row 108, 110 to identify the currently invalid imprint memory row 108, 110 as the now current valid imprint memory row 108, 110.

Figure 3A:
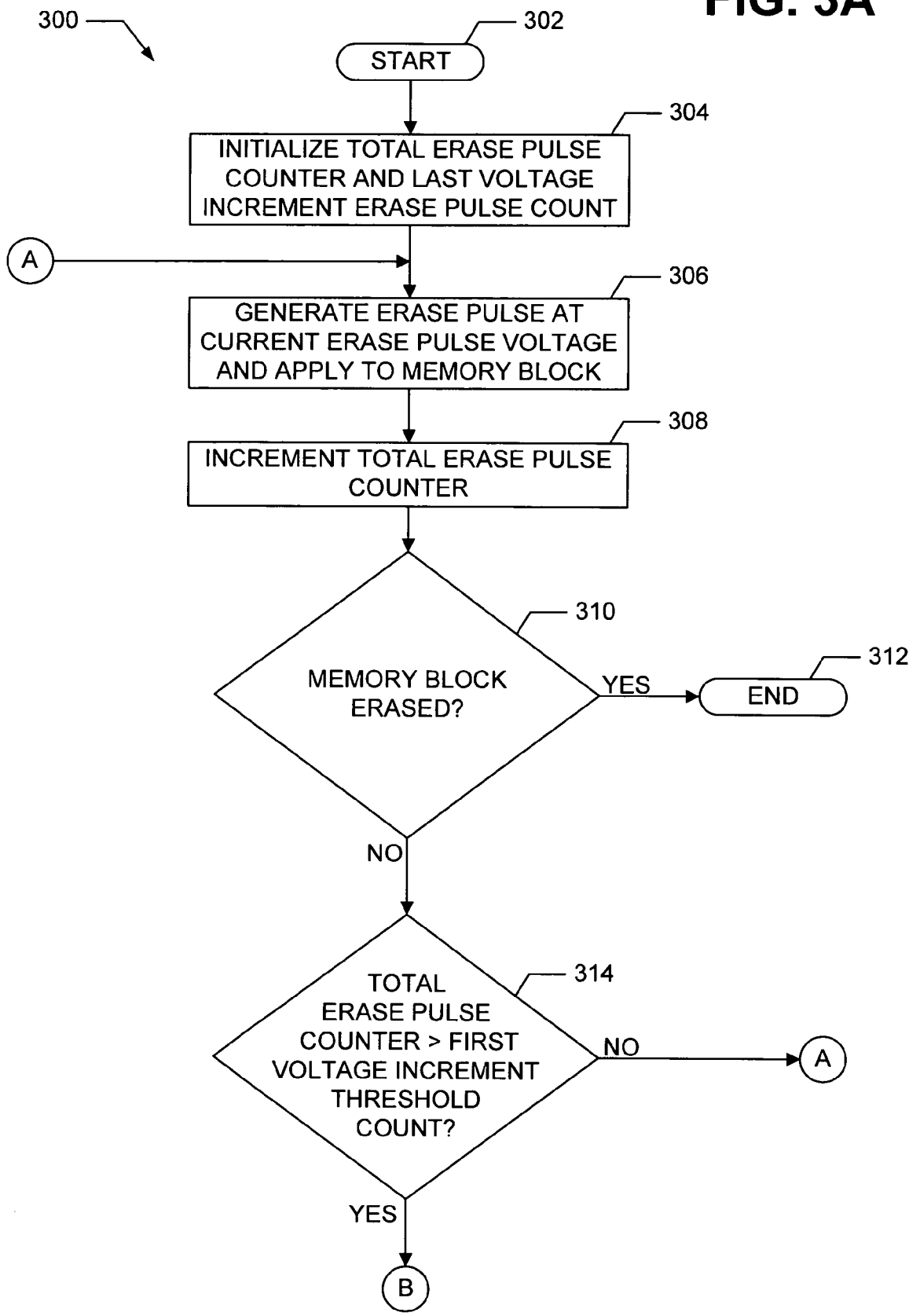
FIGS. 3A and 3B are a flowchart representation of a method employable by the memory device of FIG. 1 to erase a memory block thereof and determine a number of erase pulses for such erasure.
Figure 3B:
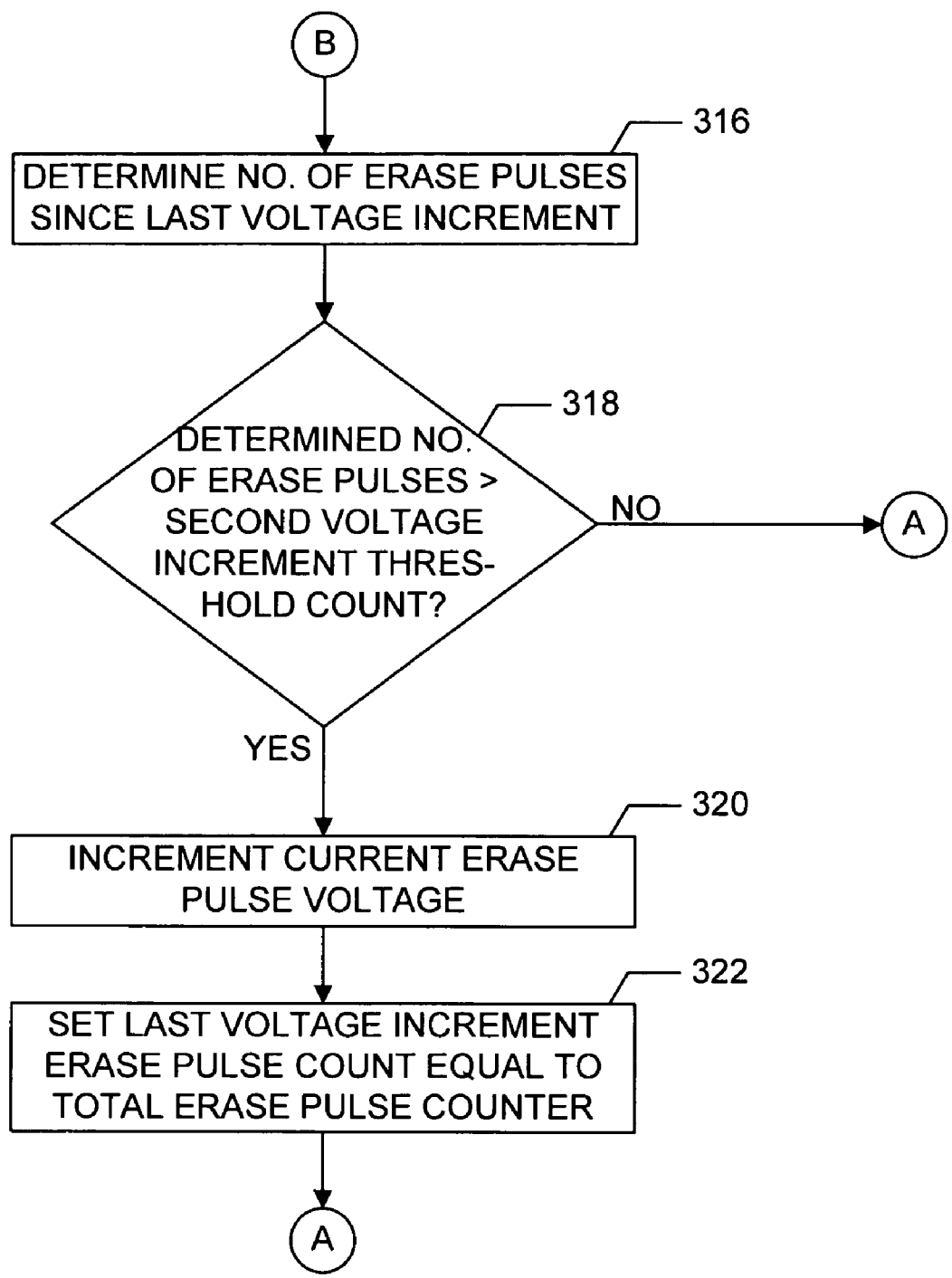

FIGS. 3A and 3B display a flowchart representation of a method 300 employable by the memory device 100 of FIG. 1 to erase an individual memory block 106 thereof while determining the number of erase pulses actually applied to the memory block 106 to accomplish the block's erasure. In the exemplary embodiment described herein, method 300 may be implemented through execution, by the processing unit 116, of software or firmware instructions stored in the non-volatile memory 114, in the processing unit 116 itself, or in other memory. After starting at 302, the processing unit 116 may, at 304, initialize a total erase pulse counter and last voltage increment erase pulse count to have values equal to zero. Generally, the total erase pulse counter comprises a software variable maintained by the processing unit 116 which stores, at any given time, the number of erase pulses that have actually been applied to a memory block 106 during erasure thereof. The last voltage increment erase pulse count, generally, comprises a software variable maintained by the processing unit 116 which stores the number of erase pulses that had actually been applied to a memory block 106 during erasure thereof at the last time that the current erase pulse voltage level was incremented. Note that the values of these software variables may be maintained in registers of the processing unit 116, in memory on board the processing unit 116, in non-volatile memory 114, in an imprint memory row 108, 110, or internal or external to the memory device 100.

Next, the voltage source 118 may, at 306 and under the direction of the processing unit 116, generate an erase pulse having a voltage equal to the current erase pulse voltage level and apply the generated erase pulse to the erase terminal 112 of the memory block 106 being erased. Then, the processing unit 116 may, at 308, increment the total erase pulse counter by one to indicate that another erase pulse has been applied to the memory block 106. A determination may then made by the processing unit 116, at 310, as to whether the memory block 106 has been fully erased. If so, the method 300 ends at 312. If not, the processing unit 116 may determine, at 314, whether the value of the total erase pulse counter is greater than a first voltage increment threshold count. The first voltage increment threshold count, generally, comprises a first threshold value against which the value of the total erase pulse counter may be compared as a first test in deciding whether the current erase pulse voltage level should be incremented as described in more detail below. The value of the first voltage increment threshold count corresponds, generally, to the number of erase pulses which should be generated and applied to a memory block 106 before any increment may be made to the current erase pulse voltage level during erasure of the memory block 106.

For flash memory devices manufactured in accordance with the exemplary embodiment described herein, the first voltage increment threshold count may have a value of approximately 30 erase pulses. It should be understood, however, that other values for the first voltage increment threshold count may be employed for other memory devices or in connection with other exemplary embodiments. Notably, the first voltage increment threshold count may be hard-coded in software or firmware executed by the processing unit 116, may be stored in non-volatile memory 114, may be stored in an imprint memory row 108, 110, or may be stored elsewhere internal or external to memory device 100. While the first voltage increment threshold count, typically, constitutes a single value applicable to all memory blocks 106 of the memory device 100 in the exemplary embodiment described herein, multiple first voltage increment threshold counts may be employed for different memory blocks 106 in other exemplary embodiments of the present invention.

If, at 314, the processing unit 116 determines that the value of the total erase pulse counter is not greater than the first voltage increment threshold count, the processing unit 116 may loop back to 306 where it causes the voltage source 108 to generate another erase pulse at the current erase pulse voltage level and apply the generated erase pulse to the erase terminal of the memory block 106 being erased. If, at 314, the processing unit 116 determines that the value of the total erase pulse counter is greater than the first voltage increment threshold count, the processing unit 116 may determine, at 316, the number of erase pulses that have been generated and applied to the memory block 106 being erased since the last voltage increment was made to the current erase pulse voltage level. Such a determination may be accomplished by subtracting the value of the last voltage increment erase pulse count from the value of the total erase pulse counter.

Continuing at 318, the processing unit 116 may decide whether the determined number of erase pulses that have been generated and applied to the memory block 106 since the last voltage increment was made to the current erase pulse voltage level is greater than a second voltage increment threshold count. The second voltage increment threshold count, generally, comprises a second threshold value against which the value of the total erase pulse counter may be compared as a second test in deciding whether the current erase pulse voltage level should be incremented as described in more detail below. The value of the second voltage increment threshold count corresponds, generally, to the number of erase pulses which may be generated and applied to a memory block 106 between increments to the current erase pulse voltage level during erasure of the memory block 106.

For flash memory devices manufactured in accordance with the exemplary embodiment described herein, the second voltage increment threshold count may have a value of approximately 10 erase pulses. It should be understood, however, that other values for the second voltage increment threshold count may be employed for other memory devices or in connection with other exemplary embodiments. Notably, the second voltage increment threshold count may be hard-coded in software or firmware executed by the processing unit 116, may be stored in non-volatile memory 114, or stored elsewhere internal or external to memory device 100. While the second voltage increment threshold count, typically, constitutes a single value applicable to all memory blocks 106 of the memory device 100 in the exemplary embodiment described herein, multiple second voltage increment threshold counts may be employed for different memory blocks 106 in other exemplary embodiments of the present invention.

If, at 318, the processing unit 116 decides that the number of erase pulses that have been generated and applied to the memory block 106 since the last voltage increment was made to the current erase pulse voltage level is not greater than the second voltage increment threshold count, the processing unit 116 may loop back to 306 where it may cause the voltage source 118 to generate another erase pulse at the current erase pulse voltage level and apply the generated erase pulse to the erase terminal of the memory block 106 being erased. If, at 318, the processing unit 116 decides that the number of erase pulses that have been generated and applied to the memory block 106 since the last voltage increment was made to the current erase pulse voltage level is greater than the second voltage increment threshold count, the processing unit 116 may increment the current erase pulse voltage level at 320 by a current erase pulse voltage level increment value. Generally, the current erase pulse voltage level increment value comprises an increment believed appropriate to compensate for erase performance degradation and cause an on-going erase cycle of a memory block 106 to complete more quickly.

For flash memory devices made according to the exemplary embodiment described herein, the current erase pulse voltage level increment value may be approximately 250 millivolts. However, it should be understood that other values for the current erase pulse voltage level increment value may be employed. The current erase pulse voltage level increment value may be hard-coded in software or firmware executed by the processing unit 116, may be stored in non-volatile memory 114, may be stored in an imprint memory row 108, 110, or may be stored elsewhere internal or external to memory device 100. While the current erase pulse voltage level increment value, typically, constitutes a single value applicable to all memory blocks 106 of the memory device 100 in the exemplary embodiment described herein, multiple current erase pulse voltage level increment values may be employed for different memory blocks 106 in other exemplary embodiments of the present invention.

After incrementing of the current erase pulse voltage level at 320, the processing unit 116 may set the last voltage increment erase pulse count equal to the total erase pulse counter at 322, thereby saving the erase pulse count at which the current erase pulse voltage level was incremented during the on-going erase cycle for the memory block 106. Then, the processing unit 116 may loop back to 306 where it causes the voltage source 118 to generate another erase pulse at the incremented current erase pulse voltage level and apply the generated erase pulse to the well terminal of the memory block 106 being erased.

It should be noted that the above-described exemplary memory device 100 and methods 200, 300 may be employed with each memory block 106 thereof on a block-by-block basis such that different initial erase pulse voltage levels may be used for subsequent erase cycles of different respective memory blocks 106 of the device 100, thereby allowing the memory device 100 to self-compensate on a block-by-block basis for each memory block's erase performance degradation.

Whereas the present invention has been described in detail with particular reference to various exemplary embodiments thereof, it is understood that variations and modifications can be effected within the spirit and scope of the invention as defined in the appended claims.

I claim:

1. An apparatus, comprising:
a memory device including a block of memory operable to store data, said memory device being adapted to at least partially erase said block of memory in a first erase cycle and in a second erase cycle subsequent to the first erase cycle, said memory device stores a first voltage increment threshold count and a second voltage increment threshold count associated with said block of memory, said memory device being further adapted to count a total number of erase pulses applied to said block of memory, said memory device being further adapted to apply an erase pulse to said block of memory during the first and the second erase cycles having an erase pulse voltage level based at least in part on the total number of erase pulses applied to said block of memory, the first voltage increment threshold count, and a second voltage increment threshold count.

2. The apparatus of claim 1, wherein the first erase pulse applied during the first erase cycle comprises an initial erase pulse applied to said block of memory.

3. The apparatus of claim 2, wherein said memory device is further adapted to apply the initial erase pulse to said block of memory during the first erase cycle having an erase pulse voltage level, and wherein the erase pulse voltage level of the initial erase pulse applied to said block of memory during the second erase cycle is greater than the erase pulse voltage level of the initial erase pulse applied to said block of memory during the first erase cycle.

4. The apparatus of claim 1, wherein said memory device is further adapted to apply a plurality of erase pulses to said block of memory during the first erase cycle and to count the number of erase pulses applied to said block of memory during the first erase cycle, said memory device being further adapted to determine the erase pulse voltage level of the erase pulse applied to said block of memory during the second erase cycle based at least in part on the number of erase pulses applied to said block of memory during the first erase cycle.

5. The apparatus of claim 4, wherein said memory device is further adapted to compare the number of erase pulses applied to said block of memory during the first erase cycle to the first voltage increment threshold count and to change the erase pulse voltage level of the erase pulse applied to said block of memory during the second erase cycle if the number of erase pulses applied to said block of memory during the first erase cycle is not less than the first voltage increment threshold count.

6. The apparatus of claim 5, wherein said memory device is further adapted to compare the number of erase pulses applied to said block of memory during the second erase cycle to the second voltage increment threshold count and to change the erase pulse voltage level of the erase pulse applied to said block of memory during subsequent erase cycles if the number of erase pulses applied to said block of memory during the second erase cycle is not less than the second voltage increment threshold count.

7. The apparatus of claim 1, wherein said memory device further includes a memory location adapted to store the erase pulse voltage level of the erase pulse, and wherein said memory device is further adapted to store the erase pulse voltage level of the erase pulse in said memory location.

8. The apparatus of claim 7, wherein said block of memory comprises a first block of memory and said memory location comprises a first memory location uniquely associated with said first block of memory, wherein said memory device further comprises a second block of memory and a second memory location uniquely associated with said second block of memory, and wherein said second memory location is adapted to store an erase pulse voltage level associated with an erase pulse applied to said second block of memory.

9. An apparatus, comprising:
a first block of memory operable to store data and to be at least partially erased in a first erase cycle and in a second erase cycle subsequent to the first erase cycle;
a first memory location uniquely associated with said first block of memory, said first memory location being adapted to store an initial erase pulse voltage level for an erase pulse to be applied to said first block of memory during the second erase cycle, and said first memory location stores a first voltage increment threshold count and a second voltage increment threshold count associated with said first block of memory;
a second block of memory operable to store data and to be at least partially erased in a first erase cycle and in a second erase cycle subsequent to the first erase cycle;
a second memory location uniquely associated with said second block of memory, said second memory location being adapted to store an initial erase pulse voltage level for an erase pulse to be applied to said second block of memory during the second erase cycle, and said second memory location stores a first voltage increment threshold count and a second voltage increment threshold count associated with said second block of memory; and,
a processing unit adapted to evaluate erase performance of said first block of memory during the first erase cycle therefor and to evaluate erase performance of said second block of memory during the first erase cycle therefor, said processing unit being further adapted to establish and store the initial erase pulse voltage level of the erase pulse applied to said first memory, and said processing unit being further adapted to establish and store the initial erase pulse voltage level of the erase pulse applied to said second block of memory based at least in part on the evaluated erase performance of said second block or memory.

10. The apparatus of claim 9, wherein the initial erase pulse voltage level for an erase pulse to be applied to said first block of memory during the second erase cycle thereof is different than the initial erase pulse voltage level for an erase pulse to be applied to said second block of memory during the second erase cycle thereof.

11. The apparatus of claim 9, wherein said apparatus further comprises a voltage source operable to apply erase pulses having respective desired erase pulse voltage levels to said first block of memory and to said second block of memory in response to signals received from said processing unit.

12. The apparatus of claim 9, wherein said processing unit is further adapted to count erase pulses applied to said first block of memory during the first erase cycle thereof in order to evaluate erase performance of said first block of memory and to compare the count to the associated first voltage increment threshold value in order to determine whether to increase the initial erase pulse voltage for an erase pulse to be applied to said first block of memory during the second erase cycle thereof, and wherein said processing unit is further adapted to count erase pulses applied to said second block of memory during the first erase cycle thereof in order to evaluate erase performance of said second block of memory and to compare the count to the associated first voltage increment threshold value in order to determine whether to increase the initial erase pulse voltage for an erase pulse to be applied to said second block of memory during the second erase cycle thereof.

13. A method for determining the erase performance of a block of memory of a memory device, comprising:
   counting a number of erase pulses applied to the block of memory during a first erase cycle;
   comparing the number of erase pulses applied to the block of memory during the first erase cycle to a first threshold number of erase pulses;
   changing an erase pulse voltage level of one or more erase pulses applied to the block of memory during a second erase cycle if the number of erase pulses applied to the block of memory during the first erase cycle is not less than the first threshold number of erase pulses;
   comparing the number of erase pulses applied to the block of memory during the second erase cycle to a second threshold number of erase pulses; and,
   changing the erase pulse voltage level of one or more erase pulses applied to the block of memory during a third erase cycle if the number of erase pulses applied to the block of memory during the second erase cycle is not less than the second threshold number of erase pulses.

14. The method of claim 13, wherein determining the erase performance of the block of memory comprises monitoring the amount of time required to erase the block of memory during the first erase cycle.

15. The method of claim 13, wherein the erase pulse voltage level applied during the first erase cycle comprises an initial erase pulse voltage level.

16. The method of claim 13, wherein the method further comprises, if the erase pulse voltage level is set, storing the erase pulse voltage level of the erase pulse in a memory location uniquely associated with the block of memory.

* * * * *